(12) United States Patent
Maute et al.

(10) Patent No.: US 8,872,209 B2
(45) Date of Patent: Oct. 28, 2014

(54) LIGHT EMITTING DIODE CHIP

(75) Inventors: Markus Maute, Alteglofsheim (DE); Karl Engl, Pentling (DE); Stefanie Rammelsberger, Zeitlarn (DE); Nikolaus Gmeinwieser, Obertraubling (DE); Johann Eibl, Wald (DE)

(73) Assignee: OSRAM Opto Semiconductors GmbH (DE)

( * ) Notice: Subject to any disclaimer, the term of this patent is extended or adjusted under 35 U.S.C. 154(b) by 77 days.

(21) Appl. No.: 13/581,417

(22) PCT Filed: Feb. 15, 2011

(86) PCT No.: PCT/EP2011/052233
§ 371 (c)(1),
(2), (4) Date: Nov. 6, 2012

(87) PCT Pub. No.: WO2011/107344
PCT Pub. Date: Sep. 9, 2011

(65) Prior Publication Data
US 2013/0146910 A1    Jun. 13, 2013

(30) Foreign Application Priority Data

Mar. 1, 2010   (DE) .................... 10 2010 009 717

(51) Int. Cl.
*H01L 33/60* (2010.01)
*H01L 33/38* (2010.01)
*H01L 33/40* (2010.01)
*H01L 33/20* (2010.01)
*H01L 33/46* (2010.01)

(52) U.S. Cl.
CPC ............... *H01L 33/60* (2013.01); *H01L 33/382* (2013.01); *H01L 33/405* (2013.01); *H01L 33/20* (2013.01); *H01L 33/46* (2013.01)
USPC ................... 257/98; 257/99; 257/79; 257/91; 438/29; 438/47; 438/46; 438/26

(58) Field of Classification Search
USPC .......... 257/98, 99, 79, 91, 81; 438/29, 47, 46, 438/26, 455
See application file for complete search history.

(56) References Cited

U.S. PATENT DOCUMENTS

| 7,259,402 B2 * | 8/2007 | Edmond et al. ................. 257/99 |
| 7,646,036 B2 * | 1/2010 | Kozawa et al. ................. 257/99 |

(Continued)

FOREIGN PATENT DOCUMENTS

| CN | 1557025 | 12/2004 |
| CN | 1582503 | 2/2005 |

(Continued)

OTHER PUBLICATIONS

English Translation of the Jul. 3, 2014 Office Action and Search Report from corresponding Chinese Application No. 201180011835.1.

*Primary Examiner* — Julio J Maldonado
*Assistant Examiner* — Jaehwan Oh
(74) *Attorney, Agent, or Firm* — DLA Piper LLP (US)

(57) ABSTRACT

A light emitting diode chip includes a semiconductor layer sequence, the semiconductor layer sequence having an active layer that generates electromagnetic radiation, wherein the light emitting diode chip has a radiation exit area at a front side. At a rear side lying opposite the radiation exit area, the light emitting diode chip has, at least in regions, a mirror layer containing silver. A functional layer that reduces corrosion and/or improves adhesion of the mirror layer is arranged on the mirror layer, wherein a material from which the functional layer is formed is also distributed in the entire mirror layer. The material of the functional layer has a concentration gradient in the mirror layer, wherein the concentration of the material of the functional layer in the mirror layer decreases proceeding from the functional layer in the direction toward the semiconductor layer sequence.

17 Claims, 2 Drawing Sheets

(56) References Cited

U.S. PATENT DOCUMENTS

| | | | |
|---|---|---|---|
| 7,859,109 B2 * | 12/2010 | Lee | 257/751 |
| 8,643,195 B2 * | 2/2014 | Slater et al. | 257/779 |
| 2003/0015721 A1 * | 1/2003 | Slater et al. | 257/99 |
| 2003/0164503 A1 | 9/2003 | Chen | |
| 2006/0033113 A1 | 2/2006 | Lee et al. | |
| 2006/0060877 A1 * | 3/2006 | Edmond et al. | 257/99 |
| 2008/0003777 A1 * | 1/2008 | Slater et al. | 438/455 |
| 2008/0185609 A1 * | 8/2008 | Kozawa et al. | 257/99 |
| 2008/0230904 A1 * | 9/2008 | Lee | 257/751 |
| 2009/0250713 A1 * | 10/2009 | Choy et al. | 257/98 |
| 2010/0171094 A1 | 7/2010 | Lu et al. | |
| 2010/0171135 A1 * | 7/2010 | Engl et al. | 257/98 |

FOREIGN PATENT DOCUMENTS

| | | |
|---|---|---|
| DE | 10 2007 022 947 A1 | 10/2008 |
| DE | 10 2009 033 686 A1 | 1/2011 |
| DE | 10 2010 024 079 | 12/2011 |
| JP | 2005-209734 A | 8/2005 |
| JP | 2006-024750 A | 1/2006 |
| WO | 2005/069389 A1 | 7/2005 |
| WO | 2008/131735 A1 | 11/2008 |
| WO | 2011/006719 A1 | 1/2011 |
| WO | 2011/157523 A1 | 12/2011 |

* cited by examiner

LIGHT EMITTING DIODE CHIP

RELATED APPLICATIONS

This is a §371 of International Application No. PCT/EP2011/052233, with an international filing date of Feb. 15, 2011 (WO 2011/107344, published Sep. 9, 2011), which is based on German Patent Application No. 10 2010 009 717.9, filed Mar. 1, 2010, the subject matter of which is incorporated by reference.

TECHNICAL FIELD

This disclosure relates to a light emitting diode chip.

BACKGROUND

WO 2008/131735 A1 discloses a light emitting diode chip wherein a first and second electrical connection layer are arranged at a rear side of the light emitting diode chip, the rear side lying opposite the radiation exit area, and are electrically insulated from one another by a separating layer, wherein a partial region of the second electrical connection layer extends from the rear side through a perforation of the active layer in the direction toward the front side of the light emitting diode chip. Such a contact-connection of a semiconductor chip has the advantage that the radiation exit area can be free of contact areas and, consequently, the emitted radiation is not shaded.

The light emitting diode chip is a so-called "thin-film" light emitting diode chip, wherein the original growth substrate of the semiconductor layer sequence is detached and, instead, the semiconductor layer sequence is connected at a side lying opposite the original growth substrate to a carrier by a solder layer. In the case of a thin-film light emitting diode chip of this type, it is advantageous if that side of the semiconductor layer sequence which faces the carrier is provided with a mirror layer to deflect radiation emitted in the direction of the carrier in the direction of the radiation exit area and thereby increase radiation efficiency.

For the visible spectral range, silver, in particular, is suitable as a material for the mirror layer. However, in the case of a mirror layer composed of silver, it is difficult to obtain both good adhesion on the semiconductor material, a good electrical connection to the semiconductor material, high reflection and reliable protection against corrosion or migration of the silver into adjacent layers.

An adhesion promoter layer can be inserted between the semiconductor surface and the mirror layer to improve adhesion of a mirror layer composed of silver on a semiconductor material. However, reflectivity is generally reduced by such an adhesion promoter layer between the semiconductor material and the mirror layer. Such an adhesion promoter layer should therefore generally be applied in a very thin fashion, whereby process control is made more difficult.

It could therefore be helpful to provide a light emitting diode chip comprising a rear-side mirror layer wherein the mirror layer is distinguished, in particular, by good adhesion on the semiconductor material, good electrical connection to the semiconductor material, high reflection and protection against corrosion and degradation or migration of the silver into adjacent layers.

SUMMARY

We provide a light emitting diode chip including a semiconductor layer sequence which has an active layer that generates electromagnetic radiation, wherein the light emitting diode chip has a radiation exit area at a front side, the light emitting diode chip has, at a rear side lying opposite the radiation exit area, at least in regions, a mirror layer containing silver, a functional layer that reduces corrosion and/or improves adhesion of the mirror layer is arranged on the mirror layer, a material from which the functional layer is formed is distributed in the entire mirror layer, wherein the material of the functional layer has a concentration gradient in the mirror layer, and a concentration of the material of the functional layer in the mirror layer decreases proceeding from the functional layer in a direction toward the semiconductor layer sequence.

We also provide a light emitting diode chip including a semiconductor layer sequence which has an active layer that generates electromagnetic radiation, wherein the light emitting diode chip has a radiation exit area at a front side, the light emitting diode chip has, at a rear side laying opposite the radiation exit area, at least in regions, a mirror layer containing silver, a functional layer that reduces corrosion and/or improves adhesion of the mirror layer is arranged on the mirror layer, a material from which the functional layer is formed is distributed in the entire mirror layer, wherein the material of the functional layer has a concentration gradient in the mirror layer, a concentration of the material of the functional layer in the mirror layer decreases proceeding from the functional layer in a direction toward the semiconductor layer sequence, the mirror layer directly adjoins the semiconductor layer sequence, and the functional layer has a thickness of 10 m to 100 nm.

DETAILED DESCRIPTION

Figure 1:
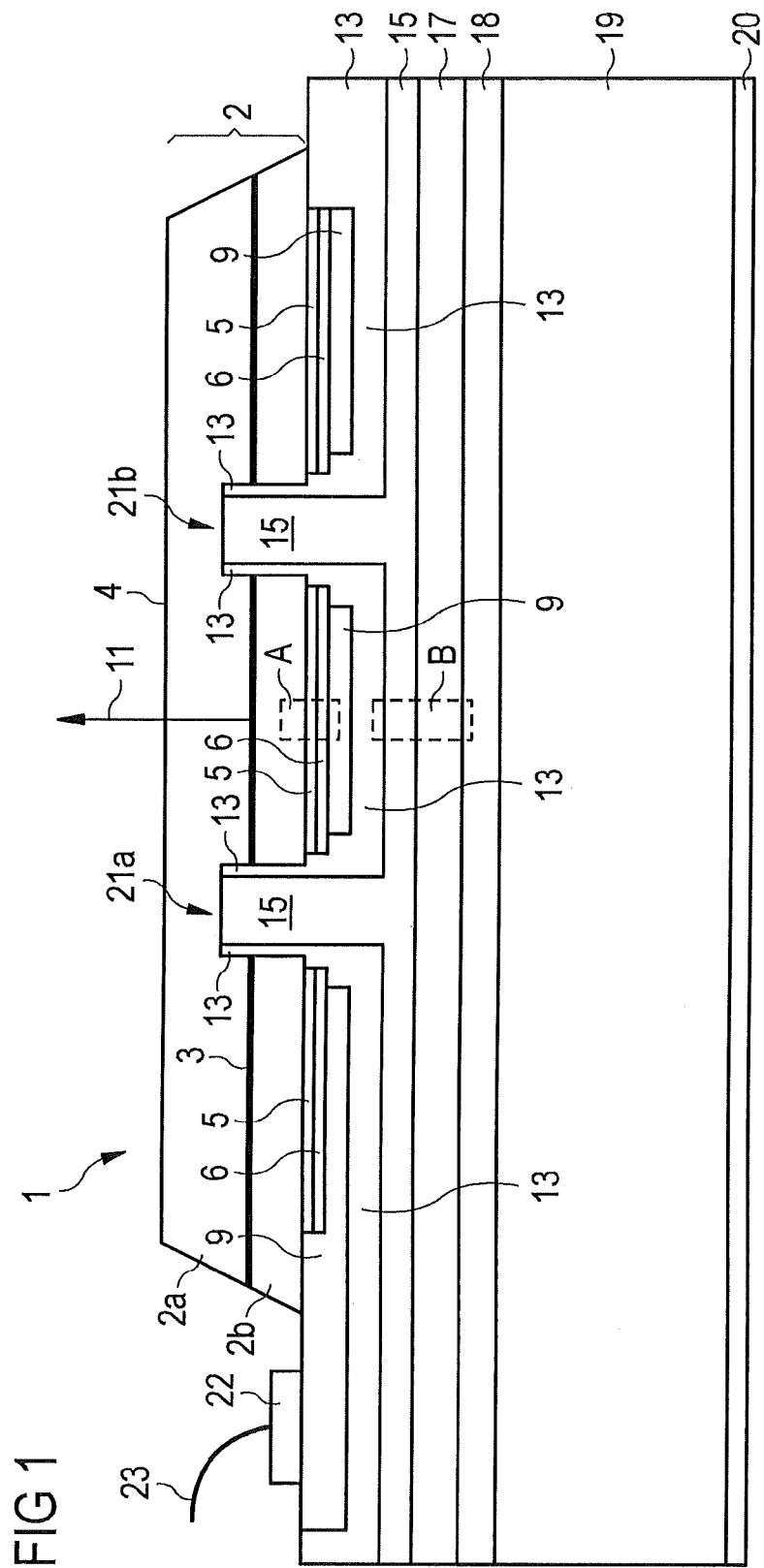
FIG. 1 shows a schematic illustration of a cross section through a light emitting diode chip in accordance with an example of our chip.

Our light emitting diode chip contains a semiconductor layer sequence having an active layer suitable to generate electromagnetic radiation. The light emitting diode chip has a radiation exit area at the front side, through which radiation exit area the electromagnetic radiation emitted by the active layer emerges from the semiconductor layer sequence. Here and hereinafter, the front side of the light emitting diode chip is understood to be that side of the light emitting diode chip at which the radiation exit area is arranged.

At a rear side lying opposite the radiation exit area, the light emitting diode chip has, at least in regions, a mirror layer containing silver. A functional layer to reduce corrosion and/or improve adhesion of the mirror layer is arranged on the mirror layer, wherein a material from which the functional layer is formed is also contained in the mirror layer.

Preferably, the mirror layer directly adjoins the semiconductor layer sequence. Therefore, in particular, no adhesion promoter layer which might lead to a reduction of the reflection at the interface between the mirror layer and the semiconductor layer sequence is arranged between the semiconductor layer sequence and the mirror layer. Rather, it has been found that the properties—desired for the mirror layer—of good adhesion on the semiconductor material, good electrical connection to the semiconductor material and protection against corrosion and silver migration can be achieved with a functional layer applied to a side of the mirror layer which lies opposite the semiconductor layer sequence, wherein the material of the functional layer is contained, in particular indiffused, in the mirror layer.

In particular, we found that introducing the material of the functional layer into the mirror layer can influence the material properties of the mirror layer in a favorable manner. The material of the functional layer is introduced into the mirror layer preferably by diffusion. Alternatively, other physical or chemical processes are also possible.

Diffusion of the material of the functional layer into the mirror layer is preferably brought about by a heat treatment process after the functional layer has been applied to the mirror layer. Through the choice of the temperature and time of the heat treatment process, diffusion of the material of the functional layer into the mirror layer can be controlled in a targeted manner.

The heat treatment is preferably effected at a temperature of 200° C. to 400° C. Particularly preferably, temperatures of 250° C. to 350° C. are set in the heat treatment process. The time required for the heat treatment is dependent on the temperature used, in particular, and can be 1 minute to 1 hour, for example.

The functional layer preferably contains platinum or consists thereof. Alternatively, the functional layer can contain nickel, chromium, palladium, rhodium or a transparent conductive oxide or can consist thereof. The transparent conductive oxide can be ITO or ZnO, for example.

Advantageously, the material of the functional layer is distributed in the mirror layer such that it is contained in a predominant portion, i.e., in more than half of the mirror layer. Preferably, the material of the functional layer is distributed in the entire mirror layer. By way of example, the material of the functional layer can be indiffused into the mirror layer so deeply that it is also detectable at an interface of the mirror layer that lies opposite the functional layer. It has been found that, in particular, adhesion of the mirror layer on the semiconductor layer sequence can be improved in this way. In this case, however, the reflectivity of the mirror layer is adversely effected to a lesser extent than if a thin adhesion promoter layer were arranged between the semiconductor layer sequence and the mirror layer.

Furthermore, we found that corrosion of silver can be reduced by introducing the material of the functional layer into the mirror layer containing silver. The cause of this effect is still not completely understood theoretically. It is conceivable that the material of the functional layer preferably diffuses along the sliver grain boundaries. This might contribute to a stabilization of the material of the mirror layer since corrosion effects generally commence at the metallic grain boundaries. Furthermore, it is conceivable that the material of the functional layer, in accordance with its position in the electrochemical series, modifies the electrical potentials that occur such that corrosion effects are suppressed. Furthermore, it is also possible for another property of the material of the functional layer which is distributed in the mirror layer, such as, for example, an effect as a catalyst or the storage of hydrogen, to have a positive influence on the durability of the mirror layer.

The material of the functional layer is preferably not distributed uniformly in the mirror layer, but rather has a concentration gradient, wherein the concentration of the material of the functional layer in the mirror layer decreases proceeding from the from the functional layer in the direction toward the semiconductor layer sequence. In particular, the concentration of the material of the functional layer can be lower at the interface between the mirror layer and the semiconductor layer sequence than at the interface between the mirror layer and the functional layer. This has the advantage that the reflectivity of the interface between the semiconductor layer sequence and the mirror layer is adversely affected only to an insignificant extent. A concentration gradient of the material of the functional layer in the mirror layer can be obtained, in particular, by the material of the functional layer being indiffused into the mirror layer, for example, by a heat treatment process.

Thicknesses of 0.1 nm to 1000 nm are possible for the functional layer. We found that particularly good results are obtained in the case of a thickness of the functional layer of 10 nm to 100 nm inclusive.

In one preferred configuration, the mirror layer is part of a reflective contact layer sequence serving both for making electrical contact with the semiconductor layer sequence and reflecting radiation in the direction of the radiation exit area of the light emitting diode chip. The reflective contact layer sequence preferably has, proceeding from the semiconductor layer sequence, at least the following layers in the stated order: the mirror layer containing silver, the functional layer that reduces corrosion and/or improves adhesion of the mirror layer, a diffusion barrier layer and a first electrical connection layer. In this case, the mirror layer advantageously directly adjoins the semiconductor layer sequence.

The first electrical connection layer is preferably formed from a material having good electrical conductivity to impress the current into the semiconductor layer sequence as uniformly as possible. Consequently, the first electrical connection layer also functions as a current spreading layer. The first electrical connection layer is electrically conductively connected to one of the electrical contacts of the light emitting diode chip. Preferably, the first electrical connection layer is a gold layer. Alternatively, the first electrical connection layer can also contain copper or nickel, for example, or consist thereof.

The diffusion barrier layer, between the functional layer and the first electrical connection layer prevents, in particular, diffusion of the material of the first electrical connection layer, for example, gold into the mirror layer containing silver, and vice versa.

The diffusion barrier layer can be a titanium layer, in particular. Alternatively, the diffusion barrier layer can contain, for example, chromium, nickel, palladium, titanium nitride or titanium tungsten nitride.

An adhesion layer is preferably arranged between the diffusion barrier layer and the first electrical connection layer. The adhesion layer is preferably a platinum layer. Alternatively, the adhesion layer can also be a chromium layer or a titanium layer.

A layer sequence wherein the functional layer is a platinum layer, the diffusion barrier layer is a titanium layer, and the adhesion layer is a platinum layer, has proved to be particularly advantageous. We found that titanium constitutes a very good diffusion barrier between the mirror layer containing silver and the first electrical connection layer, which preferably contains gold. On the other hand, however, titanium is susceptible to corrosion or oxidation, which, however, can advantageously be avoided by embedding the titanium layer between two platinum layers.

In a further advantageous configuration, the light emitting diode chip connects, at a side lying opposite the radiation exit area, to a carrier by a solder layer. The light emitting diode chip is in this case preferably a thin-film light emitting diode chip, wherein a growth substrate used for the epitaxial growth of the semiconductor layer sequence was removed from the semiconductor layer sequence and, instead, the semiconductor layer sequence was connected, at the side lying opposite the original growth substrate, to a carrier by a solder layer.

Preferably, the light emitting diode chip has a first and a second electrical connection layer, wherein the first and the second electrical connection layer face the rear side of the semiconductor layer sequence and are electrically insulated from one another by a passivation layer, wherein a partial region of the second electrical connection layer extends from the rear side of the semiconductor layer sequence through at least one perforation of the active layer in the direction toward the front side. The second electrical connection layer contains silver and functions as a second mirror layer in the case of this configuration.

Advantageously, a second functional layer that reduces corrosion and/or improves adhesion of the second electrical connection layer is arranged on the second electrical connection layer, wherein a material from which the second functional layer is formed is also contained in the second electrical connection layer. The advantageous configurations of the second electrical connection and the second functional layer correspond to the above-described advantageous configurations of the mirror layer and the functional layer. In particular, the second functional layer can be a platinum layer.

Preferably, the second electrical connection layer is, at least in regions, part of a layer sequence containing at least the following layers in the stated order: the passivation layer, the second electrical connection layer, the second functional layer, a diffusion barrier layer and a solder layer. By the solder layer, the light emitting diode chip preferably connects to a carrier at a side lying opposite the radiation exit area. The solder layer can be, for example, an AuSn layer.

The diffusion barrier layer between the second electrical connection layer and the solder layer prevents interdiffusion of the materials of the solder layer and the second electrical connection layer. Preferably, the diffusion barrier layer is a titanium tungsten nitride layer.

An adhesion layer can be contained between the passivation layer and the second electrical connection layer, the adhesion layer improving the adhesion of the second electrical connection layer on the passivation layer. Preferably, the adhesion layer is a titanium layer.

Our chips are explained in greater detail below on the basis of an example in connection with FIGS. 1 to 3.

Identical or identically acting component parts are in each case provided with the same reference signs in the figures. The component parts illustrated and the size relationships of the component parts among one another should not be regarded as true to scale.

The light emitting diode chip 1 illustrated in FIG. 1 has a semiconductor layer sequence 2 having an active layer 3 provided for emitting electromagnetic radiation 11.

The active layer 3 of the light emitting diode chip 1 can be embodied, for example, as a pn-junction, as a double heterostructure, as a single quantum well structure or multiple quantum well structure. In this case, the designation quantum well structure encompasses any structure in which charge carriers experience a quantization of their energy states as a result of confinement. In particular, the designation quantum well structure does not include any indication about the dimensionality of the quantization. It therefore encompasses, inter alia, quantum wells, quantum wires and quantum dots and any combination of these structures.

The semiconductor layer sequence 2 can, in particular, be based on a nitride compound semiconductor. "Based on a nitride compound semiconductor" means that the semiconductor layer sequence 2 or at least one layer thereof comprises a III nitride compound semiconductor material, preferably $In_xAl_yGa_{1-x-y}N$, where $0 \leq x \leq 1$, $0 \leq y \leq 1$ and $x+y \leq 1$. In this case, the material need not necessarily have a mathematically exact composition according to the above formula. Rather, it can comprise one or more dopants and additional constituents which substantially do not change the characteristic physical properties of the $In_xAl_yGa_{1-x-y}N$ material. For the sake of simplicity, however, the above formula only includes the essential constituents of the crystal lattice (In, Al, Ga, N), even if these can be replaced in part by small quantities of further substances.

The light emitting diode chip 1 emits electromagnetic radiation 11 through a radiation exit area 4 arranged at the front side of the light emitting diode chip 1. The radiation exit area 4 can be provided with a roughening or a coupling-out structure (not illustrated) to improve the coupling out of radiation.

The light emitting diode chip 1 is a thin-film light emitting diode chip. In the thin-film light emitting diode chip, the original growth substrate of the semiconductor layer sequence 2 has been detached from the light emitting diode chip 1 and, instead, the light emitting diode chip 1 has been connected, at a side lying opposite the original growth substrate, to a carrier 19 by a solder layer 18. The original growth substrate may, in particular, have been detached from that surface of the semiconductor layer sequence 2 which now functions as radiation exit area 4. In the case of the light emitting diode chip 1, therefore, an n-doped semiconductor region 2a, which is usually grown first onto the growth substrate, faces the radiation exit area 4. A p-doped semiconductor region 2b of the semiconductor layer sequence 2 faces the carrier 19. The carrier 19 can comprise germanium or silicon, for example.

To improve the efficiency of the light emitting diode chip 1, the light emitting diode chip 1 has, in regions, a mirror layer 5 at a rear side lying opposite the radiation exit area 4. The mirror layer 5 is arranged between the p-doped semiconductor region 2b and a first electrical connection layer 9 of the light emitting diode chip. Radiation emitted by the active layer 3 in the direction of the carrier 19 is advantageously reflected toward the radiation exit area 4 by the mirror layer 5.

The mirror layer 5 is part of a reflective contact layer sequence which comprises, between the mirror layer 5 and the first electrical connection layer 9, further layers, not all layers of which are shown in FIG. 1 to simplify the illustration.

Figure 2:
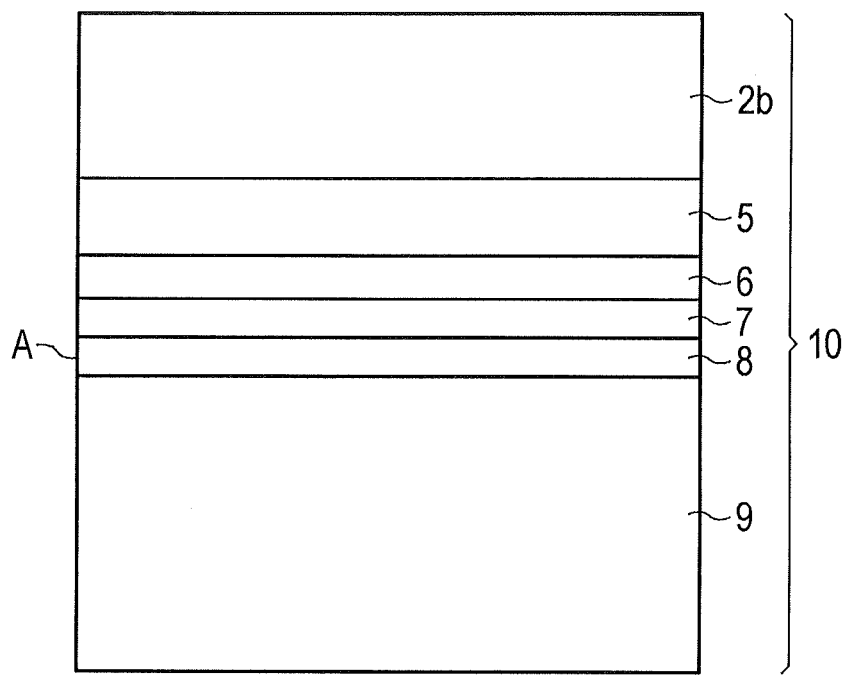
FIG. 2 shows a detailed view of the region A of the light emitting diode chip illustrated in FIG. 1.
Figure 3:
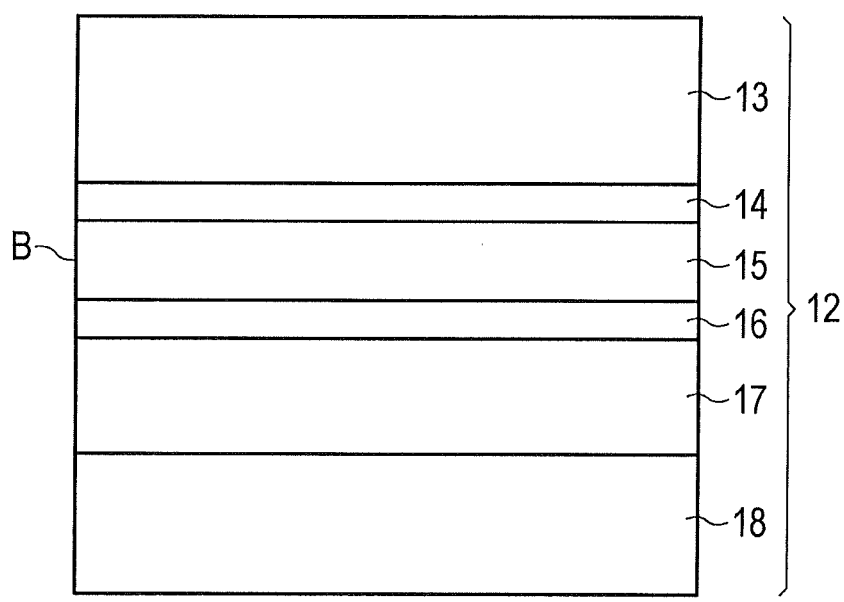
FIG. 3 shows a detailed view of the region B of the light emitting diode chip illustrated in FIG. 1.

Construction of the reflective contact layer sequence 10 is illustrated in FIG. 2, which shows a detailed view of the excerpt A from FIG. 1. The mirror layer 5 containing silver preferably directly adjoins the p-doped region 2b of the semiconductor layer sequence 2. At the side facing away from the semiconductor layer sequence 2, a functional layer 6 is arranged on the mirror layer 5. The functional layer 6 serves to reduce corrosion and/or improve adhesion and/or improving the electrical connection of the mirror layer to the semiconductor layer sequence 2. This is achieved, in particular, by virtue of the fact that the material from which the functional layer 6 is formed is at least partly also contained in the mirror layer 5. In particular, the material of the functional layer 6 can be indiffused into the mirror layer 5.

To indiffuse the material of the functional layer 6 into the mirror layer 5, the functional layer 6 is preferably subjected to heat treatment after application to the mirror layer 5 during a method for producing the light emitting diode chip 1. The heat treatment is preferably effected at a temperature of 200°

C. to 400° C., in particular at temperatures of 250° C. to 350° C. The time for the heat treatment process can be one minute to one hour, for example.

Preferably, the material of the functional layer 6 is indiffused into the mirror layer 5 such that it is contained in a predominant portion of the mirror layer 5. Particularly preferably, the material of the functional layer 6 is contained in the entire mirror layer 5. In this case, the material of the functional layer 6 is also contained in that region of the mirror layer 5 which adjoins the semiconductor layer sequence 2.

It has been found that, by virtue of the fact that the material of the functional layer 6 is also contained in the mirror layer 5, the long-term stability of the mirror layer 5 can be improved. In particular, in this way it is possible to reduce corrosion of the mirror layer 5 and to improve adhesion on the semiconductor layer sequence 2. Furthermore, such a mirror layer 5 produces a good electrical connection for the semiconductor material of the semiconductor layer sequence 2.

The material of the functional layer 6 that is contained in the mirror layer 5 can have a concentration gradient within the mirror layer 5. In particular, as a result of the indiffusion process, the concentration of the material of the functional layer 6 can be lower at a side of the mirror layer 5 facing the semiconductor layer sequence 2 than at the side facing the functional layer 6. Reflectivity of the mirror layer 5 containing silver at the interface with the semiconductor layer sequence 2 is therefore only slightly adversely affected. In particular, reflectivity of the mirror layer 5 is adversely affected by additional material of the functional layer 6 contained therein to a lesser extent than if an adhesion layer were inserted between the semiconductor layer sequence 2 and the mirror layer 5.

A functional layer 6 composed of platinum has proved to be particularly advantageous. Alternatively, however, it is also conceivable for the functional layer 6 to contain nickel, chromium, palladium, rhodium or a transparent conductive oxide such as ITO or ZnO, for example. The thickness of the functional layer 6 can be 0.1 nm to 1000 nm, for example, wherein a particularly good improvement of the stability of the mirror layer 5 is achieved with a functional layer 6 having a thickness of 10 nm to 100 nm.

In the reflective contact layer sequence 10, the functional layer 6 is followed by a diffusion barrier layer 7, which is preferably a titanium layer. Alternative materials for the diffusion barrier layer are chromium, nickel, palladium, titanium nitride or titanium tungsten nitride. The diffusion barrier layer 7 prevents interdiffusion of the materials of the mirror layer 5, in particular silver, and of the first electrical connection layer 9, for example, gold.

The diffusion barrier layer 7 is followed by an adhesion layer 8 which improves the adhesion of the following first electrical connection layer 9. The adhesion layer 8 is preferably a platinum layer but, alternatively, titanium or chromium are also suitable as materials for the adhesion layer.

The first electrical connection layer 9 is preferably a gold layer. Alternatively, the first electrical connection layer can also be formed from a different material having a good electrical conductivity, for example, copper or nickel.

Particularly advantageously, the functional layer 6 is a platinum layer, the diffusion barrier layer 7 is a titanium layer, and the adhesion layer 8 is a platinum layer. We found that titanium constitutes a very good diffusion barrier between the mirror layer 5 and the first electrical connection layer 9, wherein the two surrounding platinum layers protect the titanium layer particularly well against corrosion and/or oxidation.

As illustrated in FIG. 1, the light emitting diode chip 1 has a second electrical connection layer 15, by which contact is made with the light emitting diode chip 1 from a rear side lying opposite the radiation exit area 4. Therefore, both the first electrical connection layer 9 and the second electrical connection layer 15 are arranged at a rear side of the light emitting diode chip 1 facing the carrier 19. This has the advantage that the radiation exit area 4 is free of electrical connection layers such that the electromagnetic radiation 11 emitted by the light emitting diode chip 1 is not shaded by one of the electrical connection layers 9, 15.

The first electrical connection layer 9 preferably contacts the p-doped region 2b of the semiconductor layer sequence 2. The second electrical connection layer 15 preferably contacts the n-doped region 2a of the semiconductor layer sequence 2. For this purpose, the second electrical connection layer 15 is led from the rear side of the light emitting diode chip 1 through one or a plurality of perforations 21a, 21b, which run through the p-doped region 2b of the semiconductor layer sequence and the active layer 3, right into the n-doped region 2a of the semiconductor layer sequence 2. To prevent a short circuit, the second electrical connection layer 15 is electrically insulated from the active layer 3 and the p-doped region 2b of the semiconductor layer sequence 2 by a passivation layer 13 in the region of the perforations 21a, 21b.

Furthermore, the passivation layer 13 also insulates the second electrical connection layer 15 from the first electrical connection layer 9. The passivation layer 13 is formed from an electrically insulating material such as $SiO_2$ or SiN, for example.

The second electrical connection layer 15 contains silver and functions, in particular in the region of the perforations 21a, 21b, as a second mirror layer for the electromagnetic radiation 11 emitted by the light emitting diode chip 1.

A diffusion barrier layer 17 is arranged between the solder layer 18 and the second electrical connection layer 15. Further layers are arranged between the passivation layer 13, the second electrical connection layer 15 and the diffusion barrier layer 17, the further layers not being illustrated in FIG. 1 to simplify the illustration. The layers are shown in FIG. 3, which illustrates a detailed view of the excerpt B in FIG. 1.

An adhesion layer 14 can be arranged between the passivation layer 13 and the second electrical connection layer 15, which contains silver and acts as a second mirror layer. The adhesion layer 14 is preferably a titanium layer. The adhesion layer 14 can optionally also be omitted.

On a side lying opposite the passivation layer 13, a second functional layer 16 is applied to the second electrical connection layer 15, the second functional layer preferably being a platinum layer. In terms of its mode of operation and advantageous configurations, the second functional layer 16 corresponds to the functional layer 6 described above in connection with the mirror layer 5. In particular, the material of the functional layer 16 is also contained in the second electrical connection layer 15.

In the layer sequence 12, the functional layer 16 is followed by a diffusion barrier layer 17, which preferably contains titanium tungsten nitride. The diffusion barrier layer 17 is followed by the solder layer 18, by which the light emitting diode chip 1 is soldered onto the carrier 19. The solder layer 18 can contain AuSn, in particular. The diffusion barrier layer 17 prevents part of the solder layer 18 from diffusing into the second electrical connection layer 15, and vice versa.

The carrier 19 of the light emitting diode chip as illustrated in FIG. 1 can be, for example, a germanium carrier. At the rear side of the carrier facing away from the light emitting diode chip 1, a contact metallization 20 can be applied, via which the second electrical connection layer 15 is electrically connected toward the outside. The first electrical connection layer 9 can be electrically connected toward the outside, for example, via a bonding pad 22 and a bonding wire 23.

Our chips are not restricted by the description on the basis of the examples. Rather, this disclosure encompasses any novel feature and also any combination of features, which in particular includes any combination of features in the appended claims, even if the feature or combination itself is not explicitly specified in the claims or examples.

The invention claimed is:

1. A light emitting diode chip comprising a semiconductor layer sequence which has an active layer that generates electromagnetic radiation, wherein
   the light emitting diode chip has a radiation exit area at a front side,
   the light emitting diode chip has, at a rear side lying opposite the radiation exit area, at least in regions, a mirror layer containing silver,
   a functional layer that reduces corrosion and/or improves adhesion of the mirror layer is arranged on the mirror layer,
   a material from which the functional layer is formed is distributed in the entire mirror layer, wherein the material of the functional layer has a concentration gradient in the mirror layer, and
   a concentration of the material of the functional layer in the mirror layer decreases proceeding from the functional layer in a direction toward the semiconductor layer sequence, wherein the functional layer has a thickness of 10 nm to 100 nm.

2. The light emitting diode chip according to claim 1, wherein the mirror layer directly adjoins the semiconductor layer sequence.

3. The light emitting diode chip according to claim 1, wherein the functional layer contains platinum.

4. The light emitting diode chip according to claim 1, wherein the functional layer contains nickel, chromium, palladium, rhodium or a transparent conductive oxide.

5. The light emitting diode chip according to claim 1, wherein the mirror layer is part of a reflective contact layer sequence, which has, preceding from the semiconductor layer sequence, at least the following layers in the stated order:
   the mirror layer containing silver,
   the functional layer that reduces corrosion and/or improves adhesion of the mirror layer,
   a diffusion barrier layer, and
   a first electrical connection layer.

6. The light emitting diode chip according to claim 5, wherein the first electrical connection layer contains gold.

7. The light emitting diode chip according to claim 5, wherein the diffusion barrier layer contains titanium, chromium, nickel, palladium, titanium nitride or titanium tungsten nitride.

8. The light emitting diode chip according to claim 5, wherein an adhesion layer is arranged between the diffusion barrier layer and the first electrical connection layer.

9. The light emitting diode chip according to claim 8, wherein the adhesion layer contains platinum, titanium or chromium.

10. The light emitting diode chip according to claim 1, wherein
    the light emitting diode chip has a first electrical connection layer and a second electrical connection layer,
    the first electrical connection layer and the second electrical connection layer face the rear side of the semiconductor layer sequence and are electrically insulated from one another by a passivation layer,
    a partial region of the second electrical connection layer extends from the rear side of the semiconductor layer sequence through at least one perforation of the active layer in a direction toward the front side,
    the second electrical connection layer contains silver and functions as a second mirror layer,
    a second functional layer that reduces corrosion and/or improves adhesion of the second electrical connection layer is arranged on the second electrical connection layer, wherein a material from which the second functional layer is formed is contained in the second electrical connection layer.

11. The light emitting diode chip according to claim 10, wherein the second electrical connection layer is, at least in regions, part of a layer sequence containing at least the following layers in the stated order:
    the passivation layer,
    the second electrical connection layer,
    the second functional layer,
    a diffusion barrier layer, and
    a solder layer.

12. The light emitting diode chip according to claim 11, wherein the light emitting diode chip connects, at a side lying opposite the radiation exit area, to a carrier by means of the solder layer.

13. A light emitting diode chip comprising a semiconductor layer sequence which has an active layer that generates electromagnetic radiation, wherein
    the light emitting diode chip has a radiation exit area at a front side,
    the light emitting diode chip has, at a rear side lying opposite the radiation exit area, at least in regions, a mirror layer containing silver,
    a functional layer that reduces corrosion and/or improves adhesion of the mirror layer is arranged on the mirror layer,
    a material from which the functional layer is formed is distributed in the entire mirror layer, wherein the material of the functional layer has a concentration gradient in the mirror layer,
    a concentration of the material of the functional layer in the mirror layer decreases proceeding from the functional layer in a direction toward the semiconductor layer sequence,
    the mirror layer directly adjoins the semiconductor layer sequence, and
    the functional layer has a thickness of 10 nm to 100 nm.

14. The light emitting diode chip according to claim 13, wherein the functional layer contains platinum.

15. The light emitting diode chip according to claim 13, wherein the functional layer contains nickel, chromium, palladium, rhodium or a transparent conductive oxide.

16. The light emitting diode chip according to claim 13, wherein the mirror layer is part of a reflective contact layer sequence, which has, preceding from the semiconductor layer sequence, at least the following layers in the stated order:
    the mirror layer containing silver,
    the functional layer that reduces corrosion and/or improves adhesion of the mirror layer,
    a diffusion barrier layer, and
    a first electrical connection layer.

17. The light emitting diode chip according to claim 13, wherein
    the light emitting diode chip has a first electrical connection layer and a second electrical connection layer, the first electrical connection layer and the second electrical connection layer face the rear side of the semiconductor layer sequence and are electrically insulated from one another by a passivation layer,
a partial region of the second electrical connection layer extends from the rear side of the semiconductor layer sequence through at least one perforation of the active layer in a direction toward the front side,
the second electrical connection layer contains silver and functions as a second mirror layer,
a second functional layer that reduces corrosion and/or improves adhesion of the second electrical connection layer is arranged on the second electrical connection layer, wherein a material from which the second functional layer is formed is contained in the second electrical connection layer.

* * * * *